(12) United States Patent
Yoshida

(10) Patent No.: US 6,342,798 B1
(45) Date of Patent: Jan. 29, 2002

(54) PLL CIRCUIT USED TEMPERATURE COMPENSATED VCO

(75) Inventor: Toshiro Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/476,231

(22) Filed: Dec. 30, 1999

(30) Foreign Application Priority Data

Jan. 6, 1999 (JP) .............................. 11-001494

(51) Int. Cl.[7] .................................................. H03L 7/06
(52) U.S. Cl. ...................................... 327/156; 327/512
(58) Field of Search .............................. 327/146, 147, 327/155, 156, 512, 513; 331/25, 176

(56) References Cited

U.S. PATENT DOCUMENTS

| | | | | |
|---|---|---|---|---|
| 5,572,169 A | * | 11/1996 | Iwamoto | 331/175 |
| 5,892,408 A | * | 4/1999 | Binder | 331/44 |
| 6,023,197 A | * | 2/2000 | McKinney et al. | 331/17 |
| 6,121,844 A | * | 9/2000 | Suzuki | 331/17 |
| 6,121,845 A | * | 9/2000 | Eribes | 331/25 |

FOREIGN PATENT DOCUMENTS

| | | |
|---|---|---|
| JP | 62-202618 | 9/1987 |
| JP | 2-2721 | 1/1990 |
| JP | 4-19835 | 2/1992 |
| JP | 5-53330 | 7/1993 |
| JP | 5-347558 | 12/1993 |
| JP | 8-56151 | 2/1996 |
| JP | 8-265146 | 10/1996 |

* cited by examiner

Primary Examiner—Tuan T. Lam
Assistant Examiner—Linh Nguyen
(74) Attorney, Agent, or Firm—Ostrolenk, Faber, Gerb & Soffen, LLP

(57) ABSTRACT

A phase locked loop (PLL) circuit used a temperature compensated voltage controlled oscillator (VCO), in which phases and frequencies of the VCO are synchronized with inputted data and the VCO is always controlled to oscillates within a pull in rage of a phase comparator, is provided. The PLL circuit used the temperature compensated VCO provides a temperature/voltage converter used a temperature sensor. By giving an external control voltage to the VCO as an input voltage, the VCO is controlled to oscillate within the pull in range of the phase comparator. With this, a stable PLL operation can be always performed even when an ambient temperature changes.

6 Claims, 3 Drawing Sheets

PLL CIRCUIT USED TEMPERATURE COMPENSATED VCO

BACKGROUND OF THE INVENTION

The present invention relates to phase-locked loop (PLL) circuit which includes a temperature compensated voltage controlled oscillator (VCO) whose frequency stability is not influenced greatly, even when an ambient temperature changes.

DESCRIPTION OF THE RELATED ART

Generally, a PLL circuit consists of a phase comparator, a frequency comparator, a loop filter, a VCO and other required components. The pull-in range/lock range of the phase comparator is not usually wide, and in the event the dispersion of the oscillating frequencies of the VCO becomes large due to changes of the ambient temperature and manufacturing conditions of the VCO, a designated frequency may not be pulled in.

In order to prevent this problem, the frequency comparator may be used to widen the pull-in range. However, in the event the oscillating frequency of the VCO is largely different from a designated frequency, the designated frequency can not be pulled in. In this case, a reference clock of high accuracy, such as a quartz crystal oscillator, is needed.

In the event that inputted data is interrupted, the VCO operates at a frequency shifted largely from the designated frequency. Therefore, when data is inputted again, it takes a long time for the PLL circuit to lock again, that is, the pull-in time becomes long.

In order to solve this problem, Japanese Patent Application Laid-Open No. HEI 8-265146 discloses a PLL circuit. In this application, resistors and a thermistor are connected in series, and by changing the source from which an output voltage is obtained, one of the offset voltages, which have different gradients to compensate for varying temperature characteristics of the VCO, is outputted.

FIG. 1 is a block diagram showing a basic constitution of a convention PLL circuit. As shown in FIG. 1, the conventional PLL circuit consists of a voltage generator 10, a VCO 20, a temperature compensating circuit 30, a phase comparator 40, a loop filter 50, a reference frequency signal oscillator 60 and a frequency divider 70. In this circuit, the voltage generator 10 detects an ambient temperature and generates a voltage value in response to the ambient temperature, and outputs the voltage value to the temperature compensating circuit 30.

The temperature compensating circuit 30 compensates for the change of the modulation sensitivity of the VCO 20 based on the voltage value outputted from the voltage generator 10. Actually, the temperature compensating circuit 30 adjusts the voltage by the value of the output of the phase comparator 40 so that the multiplied value of the sensitivity value of the phase comparator 40 and the modulation sensitivity value of the VCO 20 remains a constant value regardless of the ambient temperature.

By this operation, even when the modulation sensitivity of the VCO 20 changes due to the change of the ambient temperature, the changes of the intrinsic frequency and the dumping constant are prevented. With this, the occurrence of bad influences, such as increasing the phase noise, making the pull-in time long and lessening the stability, are prevented.

FIG. 2 is a graph showing a modulation sensitivity of the VCO 20 of the conventional PLL circuit. As shown in FIG. 2, the modulation sensitivity changes when the ambient temperature changes, and these changes have two types. One type L1 occurs when the modulation sensitivity increases in response to the increase of the ambient temperature. The other type L2 occurs when the modulation sensitivity decreases in response to the increase of the ambient temperature.

FIGS. 3A and 3B are diagrams showing constitutions of the voltage generator 10 of the conventional PLL circuit. The voltage generator 10 consists of resistors R1 and R2, and a thermistor TH1. As shown in FIG. 3B, with a temperature sensitivity of the type L1 shown in FIG. 2 in which the modulation sensitivity of the VCO 20 increases in response to an increase in the ambient temperature, the voltage is outputted from a point between the thermistor TH1 and the resistor R2. And as shown in FIG. 3A, with a temperature sensitivity of the type L2 shown in FIG. 2 in which the modulation sensitivity of the VCO 20 decreases in response to an increase in the ambient temperature, the voltage is outputted from the point between the thermistor TH1 and the resistor R1.

However, in this conventional PLL circuit, in the event that the dispersion of the modulation sensitivity of the VCO occurs due to a dispersion of the manufacturing conditions of the VCO, the gradient of the thermistor value must be adjusted again. Moreover, in an optical receiver used for optical communication, the PLL circuit is used under a wide range of ambient temperature conditions from −40 to +85° C. In this case, the modulation sensitivity of the VCO is not always linear as shown in FIG. 2. There is a problem in that the temperature compensation may not be performed by the generation of voltages as shown in FIGS. 3A and 3B.

SUMMARY OF THE INVENTION

It is therefore an object of the present invention to provide a PLL circuit including a temperature compensated VCO, in which an oscillating frequency of the VCO is controlled to be within a pull-in range of a phase comparator by applying an external voltage to an input voltage of the VCO beforehand, in order to prevent the problem mentioned above. Further, the present invention provides a PLL circuit including a temperature compensated VCO, which provides a temperature/voltage converter that generates an optimal external control voltage in response to a change in the ambient temperature, and in which the VCO is always controlled to oscillate within the pull-in range of the phase comparator.

According to a first aspect of the present invention, for achieving the object mentioned above, a PLL circuit including a temperature compensated VCO, in which phases and frequencies of the VCO are synchronized with inputted data, provides a phase comparing means for detecting phase shifts of said inputted data and of signals outputted from said VCO from optimal signals, and for outputting control signals based on the detected results, a signal smoothing means for smoothing said control signals and outputting said smoothed signals to said VCO, and a temperature/voltage converting means for outputting beforehand said VCO external control voltages, with which said VCO oscillates within a pull-in range of said phase comparing means.

According to the second aspect of the present invention, in the first aspect, said temperature/voltage converting means provides a temperature sensor for sensing an ambient temperature, an analog/digital converter for converting said sensed ambient temperature to a digital signal, a memory means for storing data which is provided to said VCO as an optimal external control voltage in response to said ambient temperature, and a digital/analog converter for converting said stored data to an analog signal and outputting said analog signal to said VCO as said optimal external control signal.

According to a third aspect of the present invention, in the first aspect, temperature characteristics of said VCO are measured beforehand.

According to the fourth aspect of the present invention in the second aspect, the data stored in said memory means, which are provided to said VCO as optimal external control voltages, are based on said measured temperature characteristics of said VCO.

According to a fifth aspect of the present invention, in the second aspect, said data stored in said memory means is erasable if necessary.

According to the sixth aspect of the present invention, in the second aspect, said memory means is an electrically erasable programmable read only memory (EEPROM).

BRIEF DESCRIPTION OF THE DRAWINGS

The objects and features of the present invention will become more apparent upon consideration of the following detailed description taken in conjunction with the accompanying drawings, in which.

DESCRIPTION OF PREFERRED EMBODIMENTS

Figure 1:
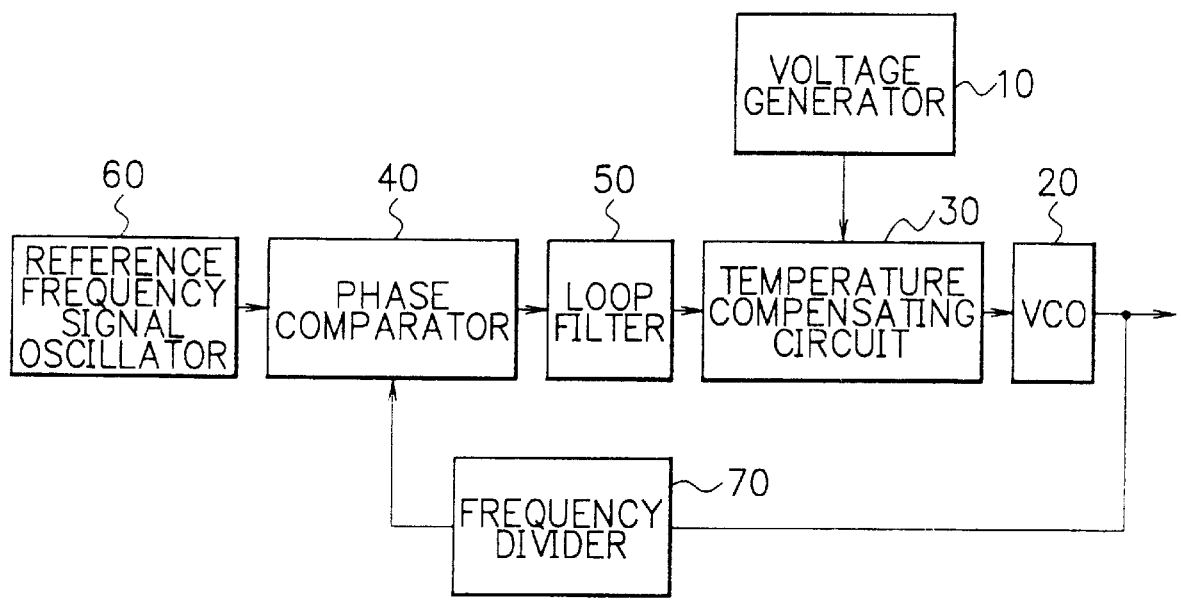
FIG. 1 is a block diagram showing a basic constitution of a conventional PLL circuit.
Figure 2:
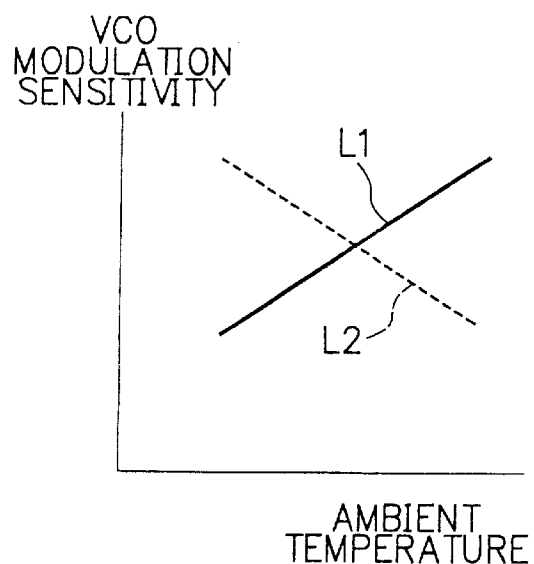
FIG. 2 is a graph showing a modulation sensitivity of a VCO of the conventional PLL circuit.
Figure 3A:
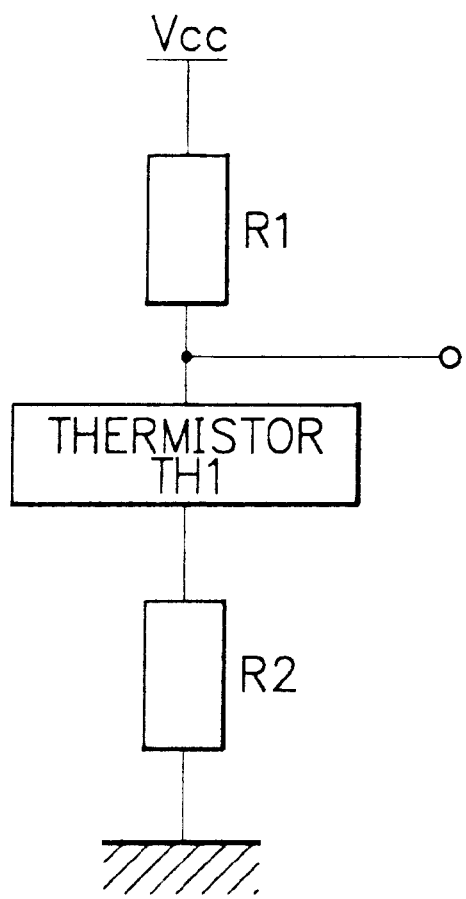
FIG. 3A is a diagram showing a constitution of a voltage generator of the conventional PLL circuit.
Figure 3B:
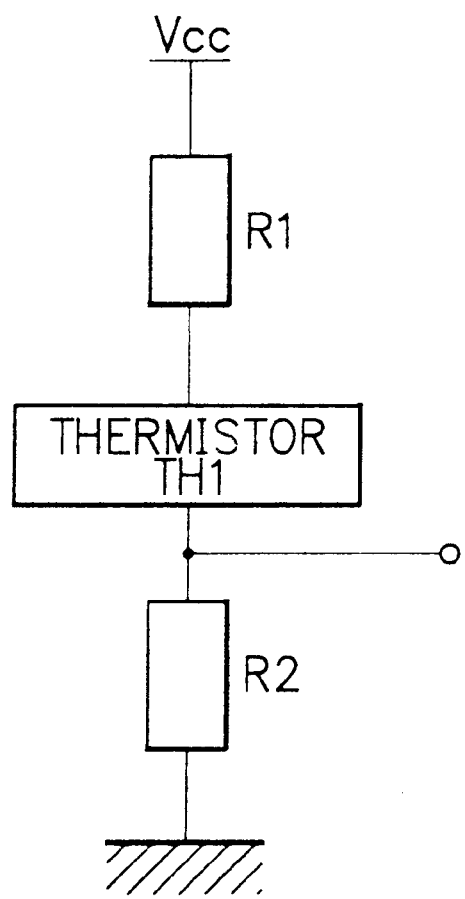
FIG. 3B is a diagram showing a constitution of an alternative voltage generator of the conventional PLL circuit.
Figure 4:
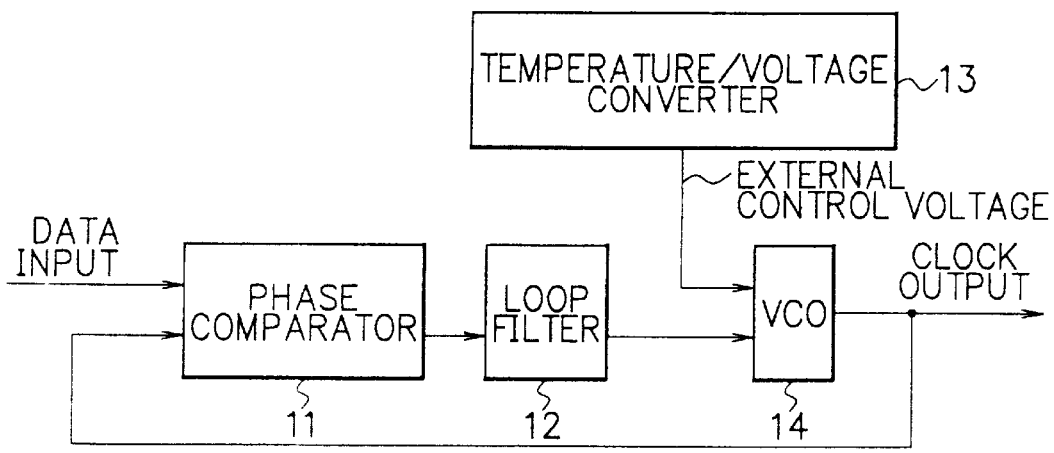
FIG. 4 is a block diagram showing a constitution of an embodiment of a PLL circuit which includes a temperature compensated VCO of the present invention.

Referring now to the drawings, an embodiment of the present invention is explained in detail. FIG. 4 is a block diagram showing a constitution of an embodiment of a PLL circuit which includes a temperature compensated VCO of the present invention. As shown in FIG. 4, the PLL circuit including the temperature compensated VCO of the present invention consists of a phase comparator 11, which detects phase shifts of inputted data and of a signal outputted from a VCO 14 from an optimal frequency and outputs a corresponding voltage in response to the detected phase lag or lead, a loop filter 12 such as a low pass filter or a lag-lead filter that decides a time constant of a PLL loop, and a temperature/voltage converter 13 that senses an ambient temperature and converts the sensed result into a voltage and output the voltage, wherein the oscillating frequency of the VCO 14 is controlled by an inputted voltage.

In FIG. 4, the phase shifts from the optimal phase of the inputted data and the signal outputted from the VCO 14 are detected at the phase comparator 11, and the phase comparator 11 outputs a control voltage in response to the detected results.

For example, if the phase of the signal outputted from the VCO 14 has a phase lead relative to the optimal phase, the phase comparator 11 generates a control voltage to decrease the oscillating frequency of the VCO 14. If the phase of the signal outputted from the VCO 14 has a phase lag relative to the optimal phase, the phase comparator 11 generates a control voltage to increase the oscillating frequency of the VCO 14.

Thereafter, the output signal from the phase comparator 11 is smoothed by the loop filter 12, and the smoothed signal is inputted to the VCO 14 as the control voltage. As a result, the oscillating frequency and the phase of the VCO 14 are kept in an optimal state. The explanation mentioned above describes the operation when the oscillating frequency of the VCO 14 is within the pull-in range of the phase comparator 11.

On the other hand, in the event that the oscillating frequency of the VCO 14 is not within the pull-in range of the phase comparator 11, the frequency can not be pulled in at the phase comparator 11, and the oscillating frequency and the phase of the VCO 14 can not be locked for the input signal. Generally, the oscillating frequency of the VCO 14 is changed largely by the ambient temperature and the manufacturing conditions of the VCO.

In order to prevent this, the present invention provides the temperature/voltage converter 13 which includes a temperature sensor. The temperature/voltage converter 13 outputs beforehand to the VCO 14 an external control signal, with which the VCO 14 oscillates within the pull-in range of the phase comparator 11. The external control signal changes optimally in response to the change of the ambient temperature. Consequently, a stable PLL operation can be always achieved.

Figure 5:
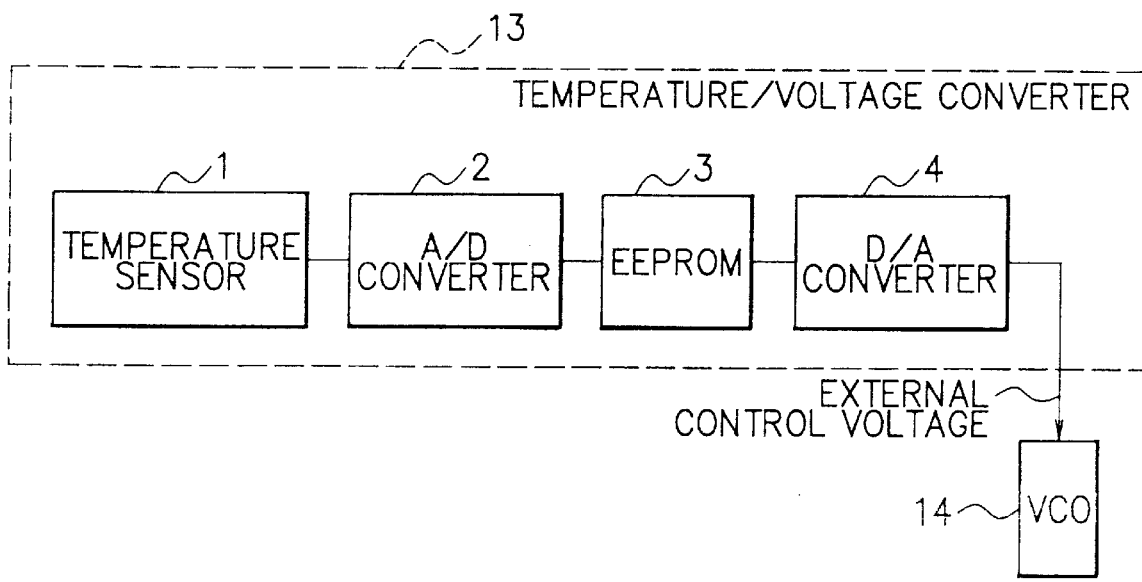
FIG. 5 is a block diagram showing a constitution of a temperature/voltage converter of the present invention.

FIG. 5 is a block diagram showing a constitution of the temperature/voltage converter 13 of the present invention. As shown in FIG. 5, the temperature/voltage converter 13 consists of a temperature sensor 1, an analog/digital (A/D) converter 2, an electrically erasable programmable read only memory (EEPROM) 3 and a digital/analog (D/A) converter 4.

In FIG. 5, an output voltage from the temperature sensor 1 is converted to a digital signal at the A/D converter 2, and the digital signal is given to the EEPROM 3 as an address. The EEPROM 3 outputs data stored in the given address to the D/A converter 4. The D/A converter 4 converts the data to an analog signal and the analog signal is outputted to the VCO 14 as the external control signal.

Temperature characteristics of the VCO 14 are measured beforehand, and data, which can always provide optimal external control signals to the VCO 14, are stored in the EEPROM 3. By using this temperature/voltage converter 13, regardless of the linearity or non-linearity of the temperature sensor, the optimal control voltage can be always provided to the VCO having various characteristics. The data stored in the EEPROM 3 can be deleted, so that when the VCO 14 is replaced by another VCO and the characteristics of the VCO is changed, the old data must be deleted and the new data must be stored.

According to the present invention, the VCO always oscillates within the pull-in range of the phase comparator. Consequently, the present invention does not need a frequency comparator and a reference clock from an external instrument, and the circuit is made to be simple.

Also according to the present invention, the VCO always oscillates within the pull-in range of the phase comparator. Therefore, when inputted data is interrupted temporarily and also when new data is inputted, the pull-in time is short.

Moreover, according to the present invention, even when the ambient temperature changes, the temperature compensation signal, with which the VCO oscillates within the pull-in range of the phase comparator, is always applied. Therefore, stable operation can always be achieved despite the changes of the ambient temperature.

Furthermore, when the present invention is used in an optical receiver in an optical communication system, even with ambient temperature changes within a wide temperature range of between −40 to +80° C., stable operation can be maintained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A phase-locked loop (PLL) circuit including a temperature compensated voltage controlled oscillator (VCO), in which phases and frequencies of the VCO are synchronized with inputted data, comprising:

a phase comparator for detecting phase shifts of said inputted data and of signals outputted from said VCO from optimal signals, and for outputting control signals based on the detected results;

a signal filter for smoothing said control signals and outputting said smoothed signals to said VCO; and a temperature/voltage converter for outputting beforehand to said VCO external control voltages, with which said VCO oscillates within a pull-in range of said phase comparator, wherein said external control voltages are varied independently from said control signals based on the detected results in the phase comparator.

2. A PLL circuit including a temperature compensated VCO in accordance with claim 1, wherein said temperature/voltage converter comprises:

a temperature sensor for sensing an ambient temperature;

an analog/digital converter for converting said sensed ambient temperature to a digital signal;

a memory for storing data provided to said VCO as an optimal external control voltage in response to said ambient temperature; and a digital/analog converter for converting said stored data to an analog signal and outputting said analog signal to said VCO as said optimal external control signal.

3. A PLL circuit including a temperature compensated VCO in accordance with claim 1, wherein:

temperature characteristics of said VCO are measured beforehand.

4. A PLL circuit including a temperature compensated VCO in accordance with claim 3, wherein:

said data to be stored in said memory and provided to said VCO as optimal external control voltages are based on said measured temperature characteristics of said VCO.

5. A PLL circuit including a temperature compensated VCO in accordance with claim 2, wherein:

said data stored in said memory are erasable if necessary.

6. A PLL circuit including a temperature compensated VCO in accordance with claim 2, wherein:

said memory is an electrically erasable programmable read only memory (EEPROM).

* * * * *